United States Patent
Liu et al.

(10) Patent No.: US 9,538,655 B2
(45) Date of Patent: Jan. 3, 2017

(54) ELECTRONIC ASSEMBLY

(71) Applicant: HTC Corporation, Taoyuan County (TW)

(72) Inventors: Hsin-Chih Liu, Taoyuan County (TW); Ying-Yen Cheng, Taoyuan County (TW); Yu-Jing Liao, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 231 days.

(21) Appl. No.: 14/460,357

(22) Filed: Aug. 15, 2014

(65) Prior Publication Data

US 2016/0050745 A1 Feb. 18, 2016

(51) Int. Cl.
| | | |
|---|---|---|
| *H05K 1/09* | (2006.01) | |
| *H05K 1/11* | (2006.01) | |
| *H05K 1/14* | (2006.01) | |
| *H05K 3/32* | (2006.01) | |
| *H05K 3/36* | (2006.01) | |
| *H05K 1/02* | (2006.01) | |
| *H05K 1/00* | (2006.01) | |

(52) U.S. Cl.
CPC ............. *H05K 1/118* (2013.01); *H05K 1/147* (2013.01); *H05K 3/323* (2013.01); *H05K 3/368* (2013.01); *H05K 1/095* (2013.01); *H05K 1/11* (2013.01); *H05K 2201/058* (2013.01); *H05K 2201/09409* (2013.01)

(58) Field of Classification Search
CPC H05K 1/11; H05K 2201/09445; H05K 1/092; H05K 1/095; H05K 1/097; H05K 2201/0133; H05K 2201/0224; H05K 2201/0272; H05K 2201/023; H05K 2201/0239; H05K 3/321; H05K 3/323; H05K 2203/0278

USPC ................ 174/257, 259; 361/749, 751
See application file for complete search history.

(56) References Cited

U.S. PATENT DOCUMENTS

| | | | | |
|---|---|---|---|---|
| 6,771,470 B1 * | 8/2004 | Yagi | ............. | G11B 5/4846 360/264.2 |
| 6,972,966 B1 * | 12/2005 | Oishi | ............. | H05K 1/141 174/250 |
| 8,030,574 B2 | 10/2011 | Lin et al. | | |

(Continued)

FOREIGN PATENT DOCUMENTS

| | | |
|---|---|---|
| TW | 200830955 | 7/2008 |
| TW | 200929468 | 7/2009 |
| TW | M473028 | 2/2014 |

OTHER PUBLICATIONS

"Office Action of Taiwan Counterpart Application," issued on Nov. 26, 2015, p. 1-p. 13.

*Primary Examiner* — Binh Tran
(74) *Attorney, Agent, or Firm* — Jianq Chyun IP Office

(57) ABSTRACT

An electronic assembly includes an electronic module, a rigid board, a first flexible board, a second flexible board and a conductive adhesive layer. The first flexible board extends from the electronic module and has a first connection end and a first pad arrangement at the first connection end. The first pad arrangement has a plurality of first pads. The second flexible board is connected to the rigid board and has a second connection end and a second pad arrangement at the second connection end. The second pad arrangement has a plurality of second pads. The first pads are structurally and electrically connected to the second pads through the conductive adhesive layer.

16 Claims, 6 Drawing Sheets

(56) References Cited

U.S. PATENT DOCUMENTS

| | | | |
|---|---|---|---|
| 2009/0102064 A1* | 4/2009 | Sawada | H01L 24/11 257/778 |
| 2009/0205200 A1* | 8/2009 | Rosenblatt | H05K 1/148 29/825 |
| 2010/0242259 A1 | 9/2010 | Kaneko | |
| 2013/0248228 A1 | 9/2013 | Liu et al. | |

\* cited by examiner

ELECTRONIC ASSEMBLY

BACKGROUND OF THE APPLICATION

1. Field of the Application

The present application relates to an electronic assembly. More particularly, the present application relates to an electronic assembly which includes a combination of a flexible board and another flexible board.

2. Description of Related Art

Hand-held devices, such as smart phones and tablet computers, have advantages such as multiple functions and carrying convenience, such that this type of hand-held devices gain more and more popularity among consumers. The hand-held devices are usually equipped with a variety of electronic modules which contains different functions, such as a liquid crystal display (LCD) module and a camera module. These electronic modules may be connected to a motherboard through a flexible board (i.e., a flexible circuit board or a flexible printed circuit (FPC)), which is configured to carry a rigid board (a rigid circuit board) of electronic components, so as to accommodate to a limited space of a housing of the hand-held device.

The aforesaid flexible board usually extends from the electronic module and has a connection end. When the connection end of the flexible board is inserted into a slot connector which has been installed to the motherboard, pad arrangements of the connection end are in contact with elastic terminal arrangements of the slot connector, thus an electrical connection is established. However, when appearances or interior configurations of the hand-held devices change with respect to position changes of the connection end of the flexible board of the electronic module, the flexible board of the electronic module has to be designed, fabricated and assembled one more time. However, this increases production costs. In addition, the slot connector of the motherboard is provided with elastic terminals for contacting the pad arrangements of the connection end of the flexible board, such that certain deformation space is needed for the elastic terminals of the slot connector, and proper distances are kept among the elastic terminals, which are reasons why a size of the slot connector cannot be further minimized.

SUMMARY OF THE APPLICATION

The present application provides an electronic assembly, which is configured for extending a transmission path of a flexible board through another flexible board.

An electronic assembly of the present application includes a first flexible board, a second flexible board and a conductive adhesive layer. The first flexible board has a first connection end and a first pad arrangement at the first connection end. The first pad arrangement has a plurality of first pads. The second flexible board has a second connection end and a second pad arrangement at the second connection end. The second pad arrangement has a plurality of second pads. The first pads are structurally and electrically connected to the second pads through the conductive adhesive layer.

An electronic assembly of the present application includes an electronic module, a first flexible board, a second flexible board and a conductive adhesive layer. The first flexible board extends from the electronic module and has a first connection end and a first pad arrangement at the first connection end. The first pad arrangement has a plurality of first pads. The second flexible board has a second connection end and a second pad arrangement at the second connection end. The second pad arrangement has a plurality of second pads. The first pads are structurally and electrically connected to the second pads through the conductive adhesive layer.

An electronic assembly of the present application includes an electronic module, a rigid board, a first flexible board, a second flexible board and a conductive adhesive layer. The first flexible board extends from the electronic module and has a first connection end and a first pad arrangement at the first connection end. The first pad arrangement has a plurality of first pads. The second flexible board is connected to the rigid board and has a second connection end and a second pad arrangement at the second connection end. The second pad arrangement has a plurality of second pads. The first pads are structurally and electrically connected to the second pads through the conductive adhesive layer.

In view of the above, in the present application, the first flexible board and the second flexible board may be combined through the conductive adhesive layer, such that a transmission path of the first flexible board may be extended through the second flexible board. Accordingly, under the circumstance that fabrications of the electronic module and the first flexible board have been completed, the second flexible board may bring flexibility for designs, so as to fully utilize the current parts. In addition, when compared to the conventional slot connector, a connection of the first flexible board and the second flexible board through the conductive adhesive layer provides a smaller space, which is beneficial for thinning an appearance of a device.

In order to make the aforementioned features and advantages of the application more comprehensible, embodiments accompanying figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DESCRIPTION OF THE EMBODIMENTS

Figure 1A:
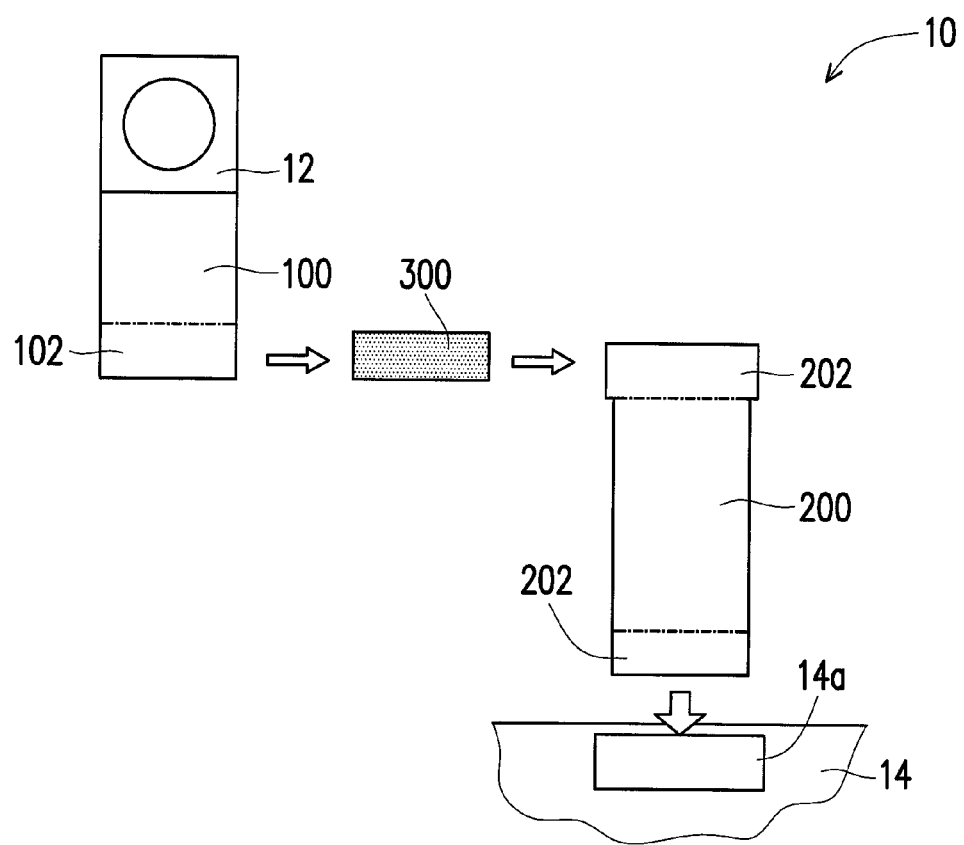
FIG. 1A is a front view illustrating an electronic assembly before being assembled according to an embodiment of the present application.

Reference will now be made in detail to the present preferred embodiments of the application, examples of which are illustrated in the accompanying drawings. Wherever possible, the same reference numbers are used in the drawings and the description to refer to the same or like parts.

With reference to FIG. 1A, an electronic assembly 10 of the present embodiment includes an electronic module 12 and a rigid board 14. The electronic module 12 may be a camera module, a sound module, a vibration module, a liquid crystal display (LCD) module, or a module having other functions. The rigid board 14 (i.e., a rigid circuit board) may be a motherboard or a module board of an electronic device (e.g., a hand-held device). The electronic assembly 10 further includes a first flexible board 100 (i.e., a first flexible circuit board), which extends from the electronic module 12. In actual fabrications, the electronic module 12 is fabricated together with the first flexible board 100 at the same time. In the conventional art, after the electronic module 12 and the first flexible board 100 are fabricated into one piece parts, a first connection end 102 of the first flexible board 100 may be connected to an electrical connector 14a (e.g., a slot connector) on the rigid board 14, such that the electronic module 12 is electrically connected to the rigid board 14 through the first flexible board 100.

Figure 1B:
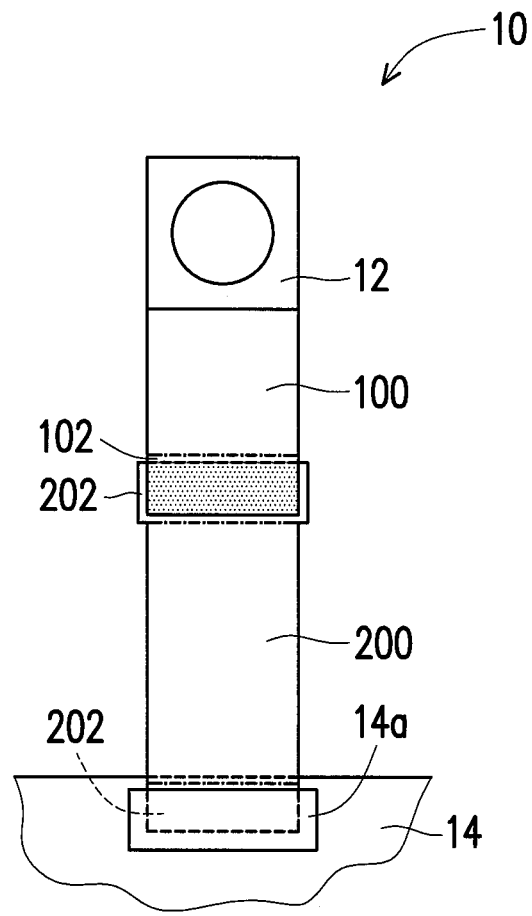
FIG. 1B is a front view illustrating the electronic device depicted in FIG. 1 after being assembled.

However, when an ornamental appearance or internal configuration of an electronic device to which the electronic assembly 10 is applied is changed, the original first connection end 102 of the first flexible board 100 cannot match to the electrical connector 14a of the rigid board 14. Accordingly, the electronic assembly 10 of the present embodiment further includes a second flexible board 200 which is configured to be an extension path of the first flexible board 100. Therefore, as shown in FIG. 1B, the electronic module 12 may be connected to the rigid board 14 through the first flexible board 100 and the second flexible board 200, sequentially. When the fabrication of the one piece parts composed of the electronic module 12 and the first flexible board 100 is completed, the additionally added second flexible board 200, in this situation, may bring more flexibility for design.

With reference to FIG. 1A, the electronic assembly 10 further includes a conductive adhesive layer 300. A second connection end 202 of the second flexible board 200 is structurally and electrically connected to the first connection end 102 of the first flexible board 100 through the conductive adhesive layer 300, while the other second connection end 202 of the second flexible board 200 is connected to the electrical connector 14a on the rigid board 14. In another embodiment not illustrated herein, the second flexible board may also be connected to the rigid board through another conductive adhesive layer.

In the present embodiment, a material of the conductive adhesive layer 300 is an anisotropic conductive adhesive (ACA). To distinguish the material by storing appearances, the anisotropic conductive adhesive (ACA) includes an anisotropic conductive paste (ACP) and an anisotropic conductive film (ACF).

Figure 2A:
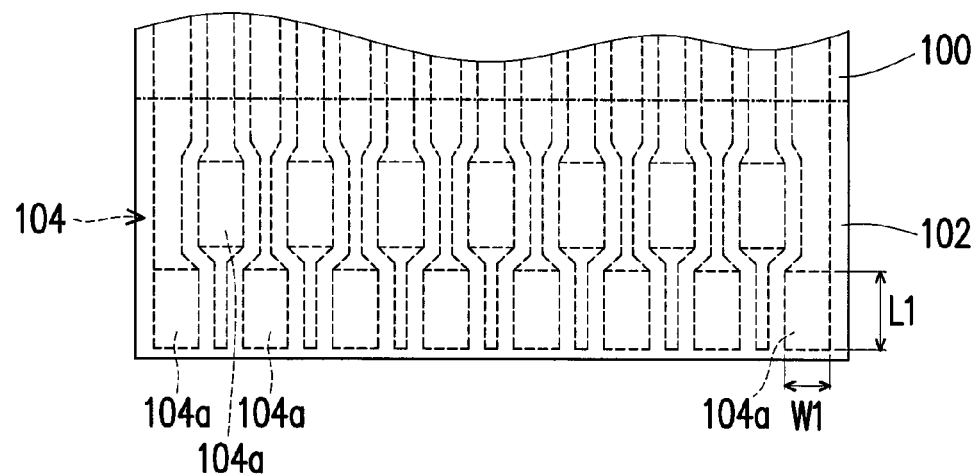
FIG. 2A is an enlarged view illustrating a first connection end depicted in FIG. 1A.

With reference to FIG. 2A, the first flexible board 100 of the present embodiment has a first pad arrangement 104, which is located at the first connection end 102. The first pad arrangement 104 has a plurality of first pads 104a, which may form conductive circuits from the first flexible board 100. In addition, with reference to FIG. 2B, the second flexible board 200 of the present embodiment has a second pad arrangement 204, which is located at the second connection end 202. The second pad arrangement 204 has a plurality of second pads 204a, which may form conductive circuits from the second flexible board 200 as well. Accordingly, the first pads 104a may be electrically connected to the corresponding second pads 204a, respectively, through the conductive adhesive layer 300. Therefore, an electrical connection relation is established between the first flexible board 100 and the second flexible board 200. In other words, the conductive adhesive layer 300 is adhered between the first pad arrangement 104 and the second pad arrangement 204. The first pads 104a are correspondingly laminated to the second pads 204a, and the first pads 104a are electrically connected to the second pads 204a through the laminated conductive adhesive layer 300. A state after integrating the first flexible board 100 and the second flexible board 200 through the conductive adhesive 300 is shown in FIG. 1B and FIG. 2C.

Figure 2B:
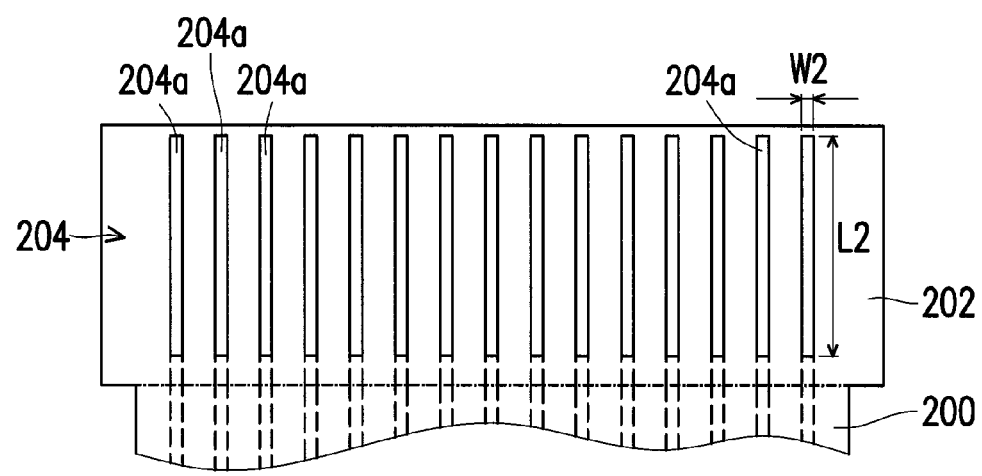
FIG. 2B is an enlarged view illustrating a second connection end depicted in FIG. 1A.
Figure 2C:
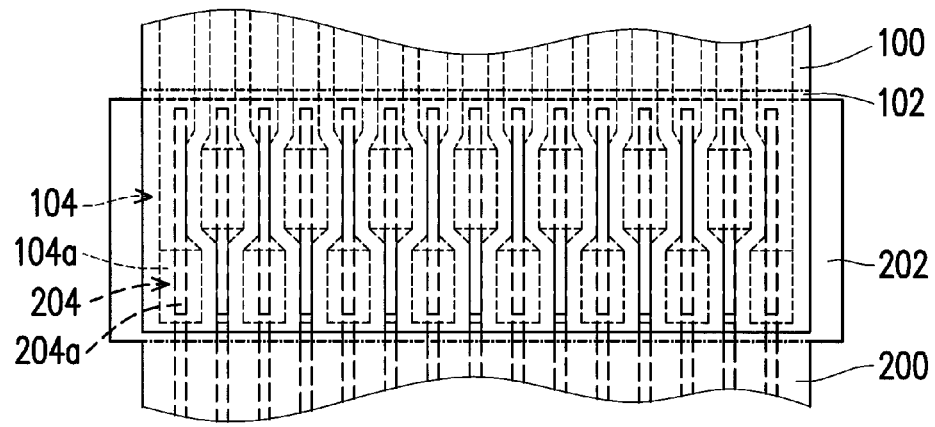
FIG. 2C is an enlarged view illustrating the first connection end, a second connection end and a conductive adhesive layer depicted in FIG. 1B after they are integrated.

With reference to FIG. 2A and FIG. 2B, in the present embodiment, a profile of the first pad 104a is short and wide, while a profile of the second pad 204a is long and thin. Accordingly, a width W1 of the first pad 104a is wider than a width W2 of the corresponding second pad 204a, and a length L1 of the first pad 104a is shorter than a length L2 of the corresponding second pad 204a.

Figure 3A:
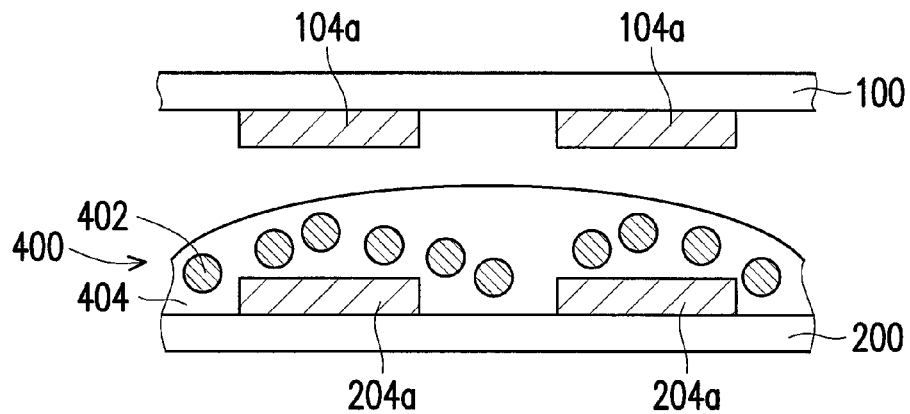
FIG. 3A to FIG. 3C are cross-sectional view illustrating a first flexible board, a second flexible board and a conductive adhesive layer depicted in FIG. 2C in a process of integrations.
Figure 3B:
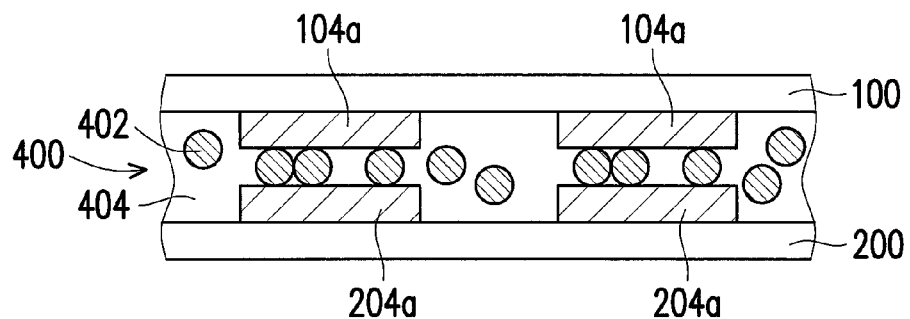

With reference to FIG. 3A, first, an anisotropic conductive paste 400 is formed on the first flexible board 100 (or the second flexible board 200) before approaching the first flexible board 100 and the second flexible board 200, such that conductive particles 402 within the anisotropic conductive paste 400 are in contact with the first pads 104a and the corresponding second pads 204a and are deemed as a conductive medium between the first pads 104a and the corresponding second pads 204a, as shown in FIG. 3B. While pressing, an insulating resin 404 of the anisotropic conductive paste 400 is also solidified through heating, so as to fill in space between the first flexible board 100 and the second flexible board 200 and structurally connects the first flexible board 100 and the second flexible board 200. The solidified insulating resin 404 becomes an insulation portion 304. Lastly, the heated and pressed anisotropic conductive paste 400 forms the conductive adhesive layer 300, as shown in FIG. 3C.

Figure 3C:
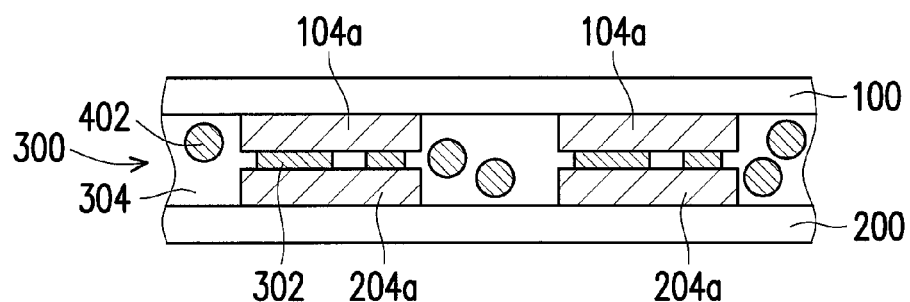

It should be noted that when a material of the conductive particles 402 of the anisotropic conductive paste 400 in the present embodiment includes solder, as shown in FIG. 3B and in the processes of laminating and heating, the conductive particles 402 may be dispersed to integrate the first pads 104a and the second pads 204a, as shown in FIG. 3C. The conductive particles 402, after being dispersed and solidified, may build up conductive portions 302 with a bigger area, which helps to ensure electrical transmissions between the first pads 104a and the second pads 204a.

Figure 4:
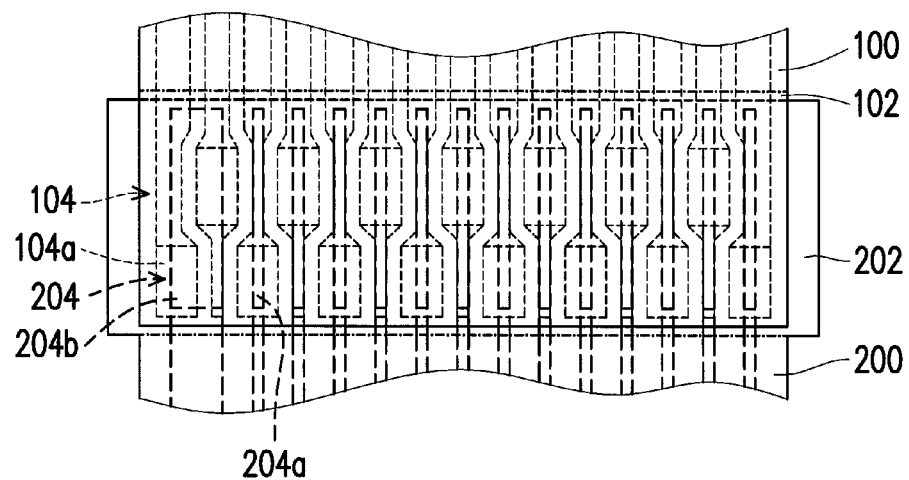
FIG. 4 is a partial enlarged view of an electronic assembly according to an embodiment of the present application.

With reference to FIG. 4, in another embodiment, when the plurality of adjacent first pads 104a contain the same electric property (e.g., power source property or ground property), the plurality of originally corresponding second pads 204a (e.g., as shown in FIG. 2B or FIG. 2C) may be connected to each other to form a bigger second pad 204b. In other words, the bigger or wider second pad 204b may be connected to one part of the first pads 104a (i.e., the plurality of the first pads 104a) through the conductive adhesive layer 300, so as to reach excellent electrical performance.

In summarizing the above, in the present application, the first flexible board and the second flexible board may be integrated through the conductive adhesive layer, such that a transmission path of the first flexible board may be extended through the second flexible board. Accordingly, under the circumstance that fabrications of the electronic module and the first flexible board have been completed, the second flexible board may bring flexibility for designs, so as to fully employ the current parts. In addition, when compared to the conventional slot connector, an integration of the first flexible board and the second flexible board through the conductive adhesive layer provides a smaller space, which is beneficial for thinning an appearance of a device. Furthermore, when the anisotropic conductive adhesive containing solar conductive particles is adopted, the solder conductive particles in the processes of pressing and heating may be dispersed to suggest a conductive layer having a bigger area for integrating two corresponding pads, which helps to ensure electrical transmissions between the two corresponding pads.

It will be apparent to those skilled in the art that various modifications and variations can be made to the structure of the present application without departing from the scope or spirit of the application. In view of the foregoing, it is intended that the present application cover modifications and variations of this application provided they fall within the scope of the following claims and their equivalents.

What is claimed is:

1. An electronic assembly, comprising:
    a first flexible board having a first connection end and a first pad arrangement at the first connection end, the first pad arrangement comprising a plurality of first pads;
    a second flexible board having a second connection end and a second pad arrangement at the second connection end, the second pad arrangement comprising a plurality of second pads; and
    a conductive adhesive layer, the first pads being structurally and electrically connected to the second pads through the conductive adhesive layer, wherein the conductive adhesive layer is adhered between the first pad arrangement and the second pad arrangement, the first pads are correspondingly laminated to the second pads, and the first pads are electrically connected to the second pads through the laminated conductive adhesive layer, and a width of the first pad is wider than a width of the corresponding second pad, and a length of the first pad is shorter than a length of the corresponding second pad.

2. The electronic assembly as claimed in claim 1, wherein one of the second pads is connected to one part of the first pads through the conductive adhesive layer.

3. The electronic assembly as claimed in claim 1, wherein a material of the conductive adhesive layer is an anisotropic conductive adhesive (ACA), and a material of conductive particles of the ACA is solder.

4. An electronic assembly, comprising:
    an electronic module;
    a first flexible board extending from the electronic module and having a first connection end and a first pad arrangement at the first connection end, the first pad arrangement comprising a plurality of first pads;
    a second flexible board having a second connection end and a second pad arrangement at the second connection end, the second pad arrangement comprising a plurality of second pads, wherein a width of the first pad is wider than a width of the corresponding second pad, and a length of the first pad is shorter than a length of the corresponding second pad; and
    a conductive adhesive layer, the first pads being structurally and electrically connected to the second pads through the conductive adhesive layer.

5. The electronic assembly as claimed in claim 4, wherein the electronic module is a camera module, a sound module, a vibration module, or a liquid crystal display (LCD) module.

6. The electronic assembly as claimed in claim 4, wherein one of the second pads is connected to one part of the first pads through the conductive adhesive layer.

7. The electronic assembly as claimed in claim 4, wherein the conductive adhesive layer is adhered between the first pad arrangement and the second pad arrangement, the first pads are correspondingly laminated to the second pads, and the first pads are electrically connected to the second pads through the laminated conductive adhesive layer.

8. The electronic assembly as claimed in claim 4, wherein a material of the conductive adhesive layer is an anisotropic conductive adhesive (ACA), and a material of conductive particles of the ACA is solder.

9. The electronic assembly as claimed in claim 4, further comprising:
    a rigid board connected to the second flexible board.

10. The electronic assembly as claimed in claim 9, wherein the rigid board is a motherboard or a module board.

11. An electronic assembly, comprising:
    an electronic module;
    a rigid board;
    a first flexible board extending from the electronic module and having a first connection end and a first pad arrangement at the first connection end, the first pad arrangement comprising a plurality of first pads;
    a second flexible board connecting to the rigid board and having a second connection end and a second pad arrangement at the second connection end, the second pad arrangement comprising a plurality of second pads, wherein a width of the first pad is wider than a width of the corresponding second pad, and a length of the first pad is shorter than a length of the corresponding second pad; and
    a conductive adhesive layer, the first pads being structurally and electrically connected to the second pads through the conductive adhesive layer.

12. The electronic assembly as claimed in claim 11, wherein the electronic module is a camera module, a sound module, a vibration module, or a liquid crystal display (LCD) module.

13. The electronic assembly as claimed in claim 11, wherein the rigid board is a motherboard or a module board.

14. The electronic assembly as claimed in claim 11, wherein one of the second pads is connected to one part of the first pads through the conductive adhesive layer.

15. The electronic assembly as claimed in claim 11, wherein the conductive adhesive layer is adhered between the first pad arrangement and the second pad arrangement, the first pads are correspondingly laminated to the second pads, and the first pads are electrically connected to the second pads through the laminated conductive adhesive layer.

16. The electronic assembly as claimed in claim 11, wherein a material of the conductive adhesive layer is an anisotropic conductive adhesive (ACA), and a material of conductive particles of the ACA is solder.

* * * * *